(12) United States Patent
Chang et al.

(10) Patent No.: US 12,176,352 B2
(45) Date of Patent: Dec. 24, 2024

(54) ELECTRONIC DEVICE

(71) Applicant: Innolux Corporation, Miao-Li County (TW)

(72) Inventors: Ardour Chang, Tainan (TW); Joe Huang, Chiayi County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 17/966,687

(22) Filed: Oct. 14, 2022

(65) Prior Publication Data

US 2023/0045613 A1  Feb. 9, 2023

Related U.S. Application Data

(63) Continuation of application No. 16/997,633, filed on Aug. 19, 2020, now Pat. No. 11,502,107.

(51) Int. Cl.
*H01L 27/12* (2006.01)
*H01L 23/00* (2006.01)
*H01L 23/31* (2006.01)

(52) U.S. Cl.
CPC ...... *H01L 27/1214* (2013.01); *H01L 23/3192* (2013.01); *H01L 23/562* (2013.01)

(58) Field of Classification Search
CPC ............. H01L 27/1214; H01L 23/3192; H01L 23/562; H01L 27/1248; H10K 59/00; G02F 1/133388; G02F 2201/503
See application file for complete search history.

(56) References Cited

U.S. PATENT DOCUMENTS

| | | | |
|---|---|---|---|
| 2018/0102399 A1* | 4/2018 | Cho | H10K 59/1216 |
| 2018/0204901 A1* | 7/2018 | Hwang | H10K 59/123 |
| 2020/0013970 A1* | 1/2020 | Wang | H10K 77/111 |
| 2020/0052051 A1* | 2/2020 | Lee | H10K 59/122 |

* cited by examiner

*Primary Examiner* — Thanh T Nguyen
(74) *Attorney, Agent, or Firm* — Patterson + Sheridan, LLP

(57) ABSTRACT

An electronic device is provided. The electronic device includes at least two non-recesses, a recess and an organic layer. The recess is disposed between the at least two non-recesses. The at least two non-recesses and the recess are formed in an insulating layer. The organic layer is disposed on the at least two non-recesses and in the recess. The organic layer includes an end which is in contact with one of the at least two non-recesses.

10 Claims, 10 Drawing Sheets

ELECTRONIC DEVICE

CROSS REFERENCE TO RELATED APPLICATIONS

This application is a Continuation of pending U.S. patent application Ser. No. 16/997,633, filed Aug. 19, 2020 and entitled "CRACK STOPPER STRUCTURE IN ELECTRONIC DEVICE", the entirety of which is incorporated by reference herein.

BACKGROUND

Technical Field

The present disclosure relates to an electronic device, and in particular it relates to a crack stopper structure in an electronic device.

Description of the Related Art

Electronic products such as display devices, antenna devices and sensor devices have become indispensable necessities in modern society. With the flourishing development of these electronic products, consumers have high expectations regarding the quality, functionality, and price of them.

The edges of a substrate of an electronic device may be easily affected by stress due to contact or collision, and the substrate and elements formed thereon may become cracked or damaged. In addition, the stress may be transferred from the edges of the substrate to the active area (working area) of the electronic device. The performance of the electronic device therefore may be affected.

As described above, the existing structure of an electronic device has not been satisfactory in all respects, and the stress modulation ability of the electronic device still needs to be improved.

SUMMARY

In accordance with some embodiments of the present disclosure, an electronic device is provided. The electronic device includes at least two non-recesses, a recess and an organic layer. The recess is disposed between the at least two non-recesses. The at least two non-recesses and the recess are formed in an insulating layer. The organic layer is disposed on the at least two non-recesses and in the recess. The organic layer includes an end which is in contact with one of the at least two non-recesses.

A detailed description is given in the following embodiments with reference to the accompanying drawings.

BRIEF DESCRIPTION OF THE DRAWINGS

The disclosure may be understood by reading the subsequent detailed description and examples with references made to the accompanying drawings, wherein.

DETAILED DESCRIPTION

Figure 1:
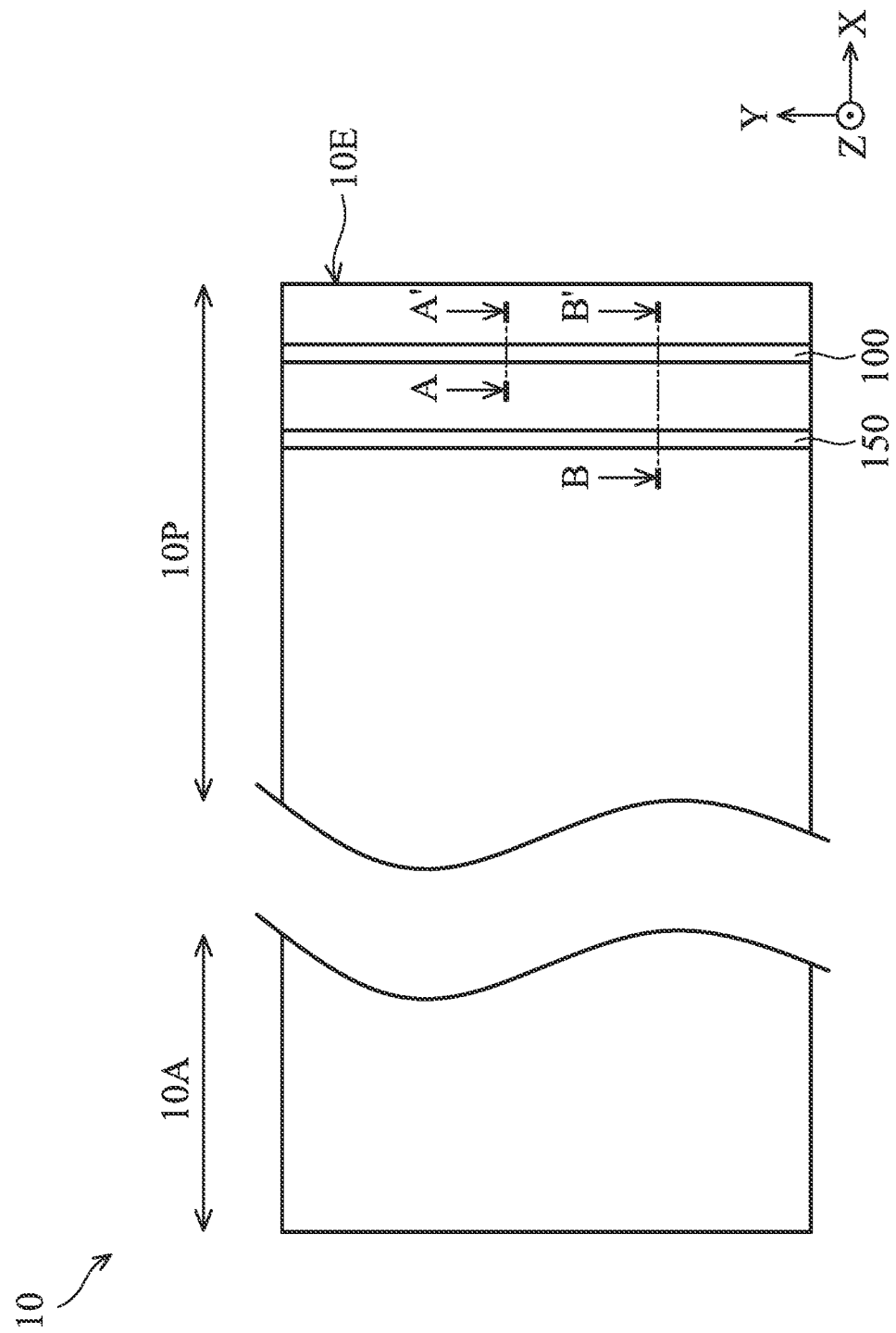
FIG. 1 is a top-view of an electronic device in accordance with some embodiments of the present disclosure.

The crack stopper structure in an electronic device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent that the exemplary embodiments set forth herein are used merely for the purpose of illustration. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

The descriptions of the exemplary embodiments are intended to be read in connection with the accompanying drawings, which are to be considered part of the entire written description. It should be understood that the drawings are not drawn to scale. In fact, the size of the element may be arbitrarily enlarged or reduced in order to clearly express the features of the present disclosure.

In addition, in the embodiments, relative expressions are used. For example, "lower", "bottom", "higher" or "top" are used to describe the position of one element relative to another. It should be appreciated that if a device is flipped upside down, an element that is "lower" will become an element that is "higher". It should be understood that when an element or layer is referred to as being "disposed on" another element or layer, it can be directly disposed on the other element or layer, or intervening elements or layers may be presented. In contrast, when an element is referred to as being "directly disposed on" another element or layer, there are no intervening elements or layers presented.

It should be understood that, although the terms "first", "second", "third" etc. may be used herein to describe various elements, components, or portions, these elements, components, or portions should not be limited by these terms.

These terms are only used to distinguish one element, component, or portion from another element, component, or portion. Thus, a first element, component, or portion discussed below could be termed a second element, component, or portion without departing from the teachings of the present disclosure.

The terms "about" and "substantially" typically mean a value is in a range of +/−10% of the stated value, or +/−5% of the stated value, or +/−3% of the stated value, or +/−2% of the stated value, or +/−1% of the stated value or +/−0.5% of the stated value. The stated value of the present disclosure is an approximate value. When there is no specific description, the stated value includes the meaning of "about" or "substantially". Furthermore, the phrase "in a range from a first value to a second value" or "in a range between a first value and a second value" indicates that the range includes the first value, the second value, and other values between them.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

It should be understood that various changes, combinations, substitutions and alterations of the embodiments in this disclosure can be made herein without departing from the spirit and scope of the disclosure.

In accordance with some embodiments of the present disclosure, a crack stopper structure in an electronic device is provided. In accordance with some embodiments of the present disclosure, the electronic device may have a substrate, the crack stopper structure may include the recess and the non-recesses that are configured in a specific manner, and the edge of the substrate is less likely to be cracked when an external force is applied thereto. In accordance with some embodiments, the crack stopper structure may include the stress-absorbing material covering the recess and the non-recesses, and therefore the crack stopper structure can reduce the stress transferred to the active area of the electronic device.

Refer to FIG. 1, which is a top-view of an electronic device 10 in accordance with some embodiments of the present disclosure. It should be understood that only some elements are illustrated in FIG. 1 for clarity. In accordance with some embodiments, additional features or elements may be optionally added to the electronic device 10. In accordance with some embodiments, some features of the electronic device 10 described below may be optionally replaced or omitted.

As shown in FIG. 1, the electronic device 10 may include an active area 10A and a peripheral area 10P. The peripheral area 10P may be adjacent to and/or surround the active area 10A, but it is not limited thereto. The active area 10A may include at least a driving element, at least a display element, at least a working element, at least a modulating element, or a combination thereof, but it is not limited thereto. The peripheral area 10P may include a crack stopper structure 100, a dam structure 150, an inorganic encapsulation region (not illustrated), other non-working (dummy) elements or a combination thereof, but it is not limited thereto. In addition, the peripheral area 10P may extend to the edge 10E of the electronic device 10. In other words, the peripheral area 10P may include the edge 10E. The edge 10E may be the edge of the substrate, but it is not limited thereto. In accordance with some embodiments, the active area 10A may correspond to a working area and the peripheral area 10P may correspond to a non-working area of the electronic device 10, for example, in a display device, the active area 10A may correspond to a display area and the peripheral area 10P may correspond to a non-display area. The crack stopper structure 100 may be disposed between the active area 10A and the edge 10E. In some embodiment, the edge of the light emitting layer of the light-emitting unit (not shown) located closest to the edge 10E can serve as a boundary separating the active area 10A and a peripheral area 10P.

In accordance with some embodiments, the electronic device 10 may include a display device, an antenna device, a sensing device, a tiled device, other suitable device, or a combination thereof, but it is not limited thereto. The electronic device 10 may be a bendable or flexible electronic device. The electronic device 10 may include, for example, a liquid-crystal display (LCD) device, a light-emitting diode (LED) display device, such as an inorganic light-emitting diode display device, an organic light-emitting diode (OLED) display device, a mini light-emitting diode (mini LED) display device, a micro light-emitting diode (micro LED) display device, or a quantum dot (QD) light-emitting diode (QLED or QDLED) display device. In accordance with some embodiments, the liquid-crystal display device may include a backlight module. The backlight module may include light-emitting diodes, such as inorganic light-emitting diodes, organic light-emitting diodes, mini light-emitting diodes, micro light-emitting diode, or quantum dot light-emitting diode, fluorescence material, phosphor, another suitable material, or a combination thereof, but it is not limited thereto. The antenna device may be, for example, a liquid-crystal antenna device, but it is not limited thereto. The tiled device may be, for example, a tiled display device or a tiled antenna device, but it is not limited thereto.

Figure 2:
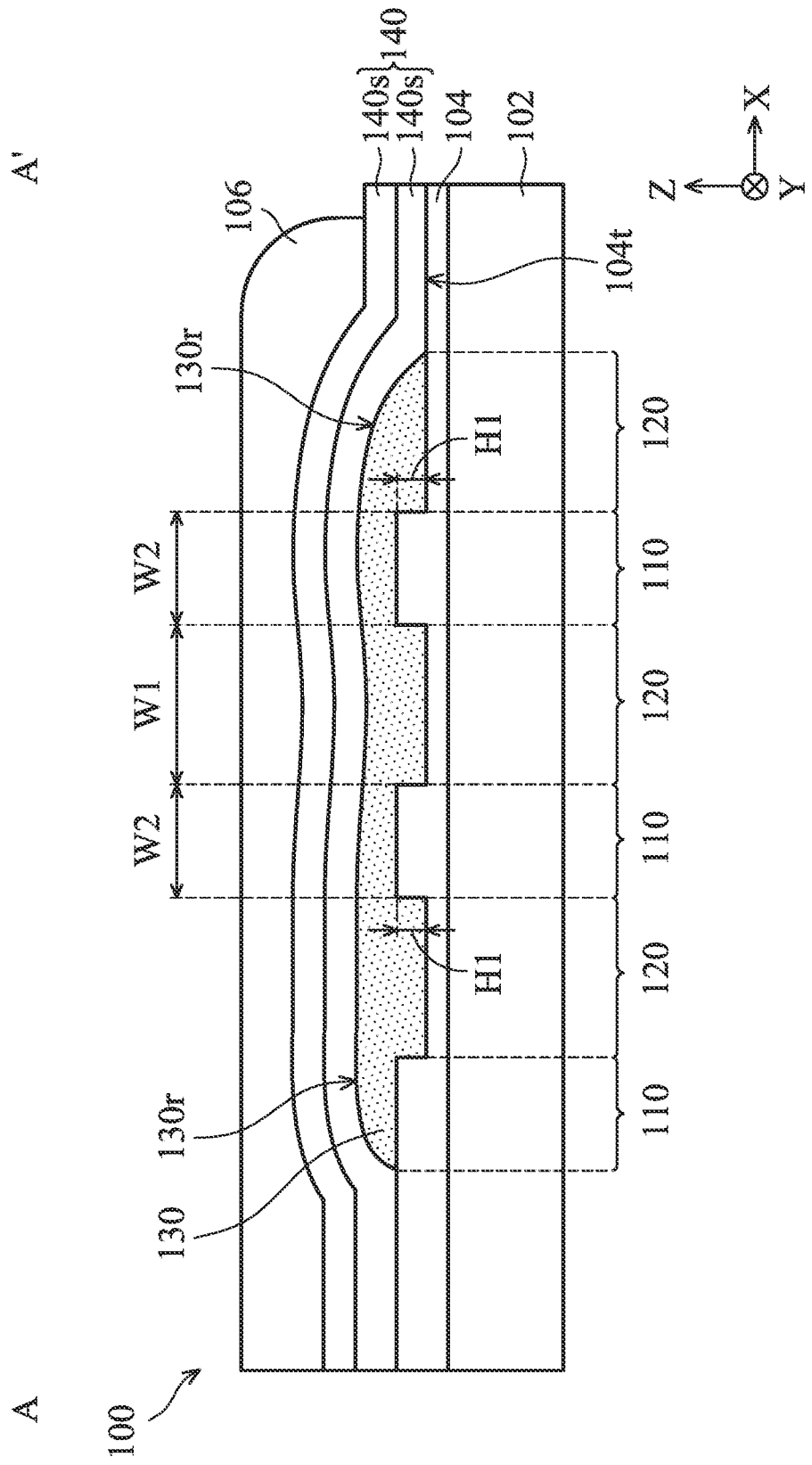
FIG. 2 is a cross-sectional view of an electronic device along line segment A-A' in FIG. 1 in accordance with some embodiments of the present disclosure.

Refer to FIG. 2, which is a cross-sectional view of the electronic device 10 along line segment A-A' in FIG. 1 in accordance with some embodiments of the present disclosure. FIG. 2 illustrates the detailed structure of the crack stopper structure 100 in accordance with some embodiments.

As shown in FIG. 2, the crack stopper structure 100 may include at least two non-recesses 110 and at least one recess 120 disposed between the at least two non-recesses 110. In accordance with some embodiments, the non-recesses 110 and the recesses 120 may be formed in an insulating layer 104. In accordance with some embodiments, the insulating layer 104 may be formed on a substrate 102. In accordance with some embodiments shown in FIG. 1, the insulating layer 104 may extend from the active area 10A to the peripheral area 10P. In accordance with some embodiments, the insulating layer 104 may serve as a gate oxide layer, a buffer layer, a dielectric layer, other suitable insulating layer, or a combination thereof in the active area 10A, but the disclosure is not limited thereto. In accordance with some embodiments, there is no metal layer disposed below the non-recesses 110 and the recesses 120, but the disclosure is not limited thereto.

In accordance with some embodiments, the substrate 102 may include a flexible substrate, but the disclosure is not limited thereto. In accordance with some embodiments, the material of the substrate 102 may include, but is not limited to, polyimide (PI), polycarbonate (PC), polyethylene terephthalate (PET), another suitable material, or a combination thereof. In accordance with some embodiments, the substrate 102 may include a printed circuit board (PCB) or other rigid substrate materials such as glass or sapphire, but the disclosure is not limited thereto.

In accordance with some embodiments, the insulating layer 104 may include an inorganic material, but the disclosure is not limited thereto. In accordance with some embodiments, the material of the insulating layer 104 may include, but is not limited to, silicon oxide, silicon nitride, silicon oxynitride, high-k dielectric material, other suitable dielectric materials or a combination thereof. The high-k dielectric material may include, but is not limited to, a metal oxide, a metal nitride, a metal silicide, a metal aluminate, a zirconium silicate, a zirconium aluminate, or a combination thereof. In accordance with some embodiments, the insulating layer 104 may have a single-layered structure or a multi-layered structure, and the materials of the sub-layers in the multi-layered structure may be the same or different.

In accordance with some embodiments, a chemical vapor deposition (CVD) process, a physical vapor deposition (PVD) process, a coating process, another suitable process, or a combination thereof may be used to form the insulating layer 104. The chemical vapor deposition process may include, for example, a low pressure chemical vapor deposition (LPCVD) process, a low temperature chemical vapor deposition (LTCVD) process, a rapid thermal chemical vapor deposition (RTCVD) process, and a plasma-enhanced chemical vapor deposition (PECVD) process, or an atomic layer deposition (ALD) process. The physical vapor deposition process may include, for example, a sputtering process, an evaporation process, or a pulsed laser deposition.

In accordance with some embodiments, the recess 120 may be formed by a patterning process. The patterning process may include a photolithography process and/or an etching process. The photolithography process may include, but is not limited to, photoresist coating (such as spin coating), soft baking, hard baking, mask alignment, exposure, post-exposure baking, photoresist development, cleaning and drying. The etching process may include a dry etching process or a wet etching process, but it is not limited thereto.

As shown in FIG. 2, the recess 120 may be greater than each of the two non-recesses 110 in width. Specifically, in accordance with some embodiments, the recess 120 may have a width of W1, one of the two non-recesses 110 may have a width of W2, and width W1 may be greater than width W2. In accordance with some embodiments, the width W1 of the recess 120 may be greater than a height H1 of the two non-recesses 110.

It should be noted that the recess 120 and the non-recesses 110 that are configured in the above manner can reduce the risk of damaging or cracking the substrate 102 and/or the elements (e.g., the insulating layer 104) formed thereon when an external force is applied to the substrate 102. Specifically, since the recess 120 is greater than the two non-recesses 110 in width, the probability of the non-recesses 110 colliding together can be decreased.

In accordance with some embodiments, the width W1 of the recess 120 may be in a range from 3 μm to 15 μm (3 μm≤W1≤15 μm), for example, the width W1 may be 5 μm, 6 μm, 7 μm, 8 μm, or 9 μm, but the disclosure is not limited thereto. In accordance with some embodiments, the width W2 of the non-recess 110 may be in a range from 2 μm to 10 μm (2 μm≤W2≤10 μm), for example, the width W2 may be 4 μm, 5 μm, 6 μm, or 7 μm, but the disclosure is not limited thereto. It should be understood that although the widths of the two non-recesses 110 are labeled by the same numeral reference, the widths of the two non-recesses 110 that are adjacent to the recess 120 may be the same or different.

In accordance with some embodiments, the height H1 of the non-recess 110 may be in a range from 0.5 μm to 1.5 μm (0.5 μm≤H1≤1.5 μm), for example, the height H1 may be 1.5 μm, 2 μm, or 2.5 μm, but the disclosure is not limited thereto. It should be understood that although the heights of the two non-recesses 110 are labeled by the same numeral reference, the heights of the two non-recesses 110 that are adjacent to the recess 120 may be the same or different.

In accordance with some embodiments, the crack stopper structure 100 may further include a stress-absorbing material 130 disposed on the insulating layer 104, and the stress-absorbing material 130 may be disposed in the recess 120. In accordance with some embodiments, the stress-absorbing material 130 may be filled in the recess 120. In accordance with some embodiments, the stress-absorbing material 130 may be disposed on the two non-recesses 110. In accordance with some embodiments, the stress-absorbing material 130 may cover both the recess 120 and the two non-recesses 110. In accordance with some embodiments, a portion of a surface of the stress-absorbing material 110 may have a curved profile 130r.

In accordance with some embodiments, the Young's modulus of the stress-absorbing material 130 may be less than the Young's modulus of the insulating layer 104. In accordance with some embodiments, the Young's modulus of the stress-absorbing material 130 may be in a range from 1 GPa to 5 GPa (1 GPa≤Young's modulus of the stress-absorbing material≤5 GPa), for example, the Young's modulus of the stress-absorbing material may be 2 GPa, 2.5 GPa, or 3 GPa, but the disclosure is not limited thereto. In accordance with some embodiments, the Young's modulus of the insulating layer 104 may be in a range from 40 GPa to 460 GPa (40 GPa≤Young's modulus of the insulating layer≤460 GPa), for example, the Young's modulus of the insulating layer may be 110 GPa, 120 GPa, 130 GPa, 140 GPa, 150 GPa, or 160 GPa, but the disclosure is not limited thereto. In some embodiments, the Young's modulus of the materials mentioned in the present disclosure may be obtained from textbooks, journals, an encyclopedia (such as Wikipedia), or measurements of instruments, but it is not limited thereto.

It should be noted that since the Young's modulus of the stress-absorbing material 130 is less than the Young's modulus of the insulating layer 104, the stress-absorbing material 130 can absorb more stress energy than the insulating layer 104. Therefore, the above configuration can reduce the stress transferred to the active area 10A when an external force is applied to the substrate 102, or reduce the risk of cracking the insulating layer 104.

In accordance with some embodiments, the stress-absorbing material 130 may include an organic material. In accordance with some embodiments, the stress-absorbing material 130 may include, but is not limited to, epoxy resins, silicone resins, acrylic resins (such as polymethylmetacrylate (PMMA)), polyimide, perfluoroalkoxy alkane (PFA), polytetrafluoroethylene (PTFE), fluorinated ethylene propylene (FEP), polyethylene, benzo-cyclo-butene (BCB), polyvinylpyrrolidone (PVP), polyvinylfluoride (PVF), polyvinylidene fluoride (PVDF), polydimethylsiloxane (PDMS), another suitable material, or a combination thereof. In accordance with some embodiments, the stress-absorbing material 130 may have a single-layered structure or a multi-layered structure, and the materials of the sub-layers of the multi-layered structure may be the same or different.

In accordance with some embodiments, the aforementioned chemical vapor deposition (CVD) process, physical vapor deposition (PVD) process, coating process, another suitable process, or a combination thereof may be used to form the stress-absorbing material 130 on the insulating layer 104.

In addition, referring to FIG. 2, in accordance with some embodiments, the crack stopper structure 100 may further include an inorganic layer 140 covering the stress-absorbing material 130. The inorganic layer 140 can protect the stress-absorbing material 130 and reduce the moisture entering the stress-absorbing material 130. In accordance with some embodiments, the inorganic layer 140 may extend from the active area 10A to the peripheral area 10P, but the disclosure is not limited thereto. In accordance with some embodiments, the inorganic layer 140 may extend on the top surface 104t of the insulating layer 104 along the X direction (i.e., the direction from the an active area 10A to the peripheral area 10P) shown in the drawings, contact with the insulating layer 104, and encapsulate the stress-absorbing material 130 between the insulating layer 104 and the inorganic layer 140. In accordance with some embodiments, the inorganic layer 140 may be formed on the stress-absorbing material 130 and have a curved profile.

In accordance with some embodiments, the Young's modulus of the stress-absorbing material 130 may be less than the Young's modulus of the inorganic layer 140. In accordance with some embodiments, the Young's modulus of the inorganic layer 140 may be in a range from 40 GPa to 460 GPa (40 GPa≤Young's modulus of the inorganic layer≤460 GPa), for example, the Young's modulus of the insulating layer may be 110 GPa, 150 GPa, 200 GPa, 250 GPa, 300 GPa, or 350 GPa, but the disclosure is not limited thereto.

It should be noted that since the Young's modulus of the stress-absorbing material 130 is less than the Young's modulus of the inorganic layer 140, the stress-absorbing material 130 can absorb more stress energy than the inorganic layer 140. Therefore, the above configuration can reduce the stress transferred to the active area 10A when an external force is applied to the substrate 102, or reduce the risk of cracking the inorganic layer 140.

In accordance with some embodiments, the inorganic layer 140 may include a thin-film encapsulation (TFE) layer. In accordance with some embodiments, the material of the inorganic layer 140 may include, but is not limited to, silicon oxide, silicon nitride, silicon oxynitride, another suitable dielectric material, or a combination thereof. In accordance with some embodiments, the inorganic layer 140 may have a single-layered structure or a multi-layered structure. As shown in FIG. 2, in accordance with some embodiments, the inorganic layer 140 may have a plurality of sub-layers 140s. The sub-layers 140s of the inorganic layer 140 may include the same or different materials.

In accordance with some embodiments, the aforementioned chemical vapor deposition (CVD) process, physical vapor deposition (PVD) process, coating process, another suitable process, or a combination thereof may be used to form the inorganic layer 140, but the disclosure is not limited thereto.

In addition, in accordance with some embodiments, the crack stopper structure 100 may further include a planarization layer 106, and the planarization layer 106 may be disposed on the inorganic layer 140 and covering the stress-absorbing material 130. In accordance with some embodiments, the planarization layer 106 may extend from the active area 10A to the peripheral area 10P which are shown in FIG. 1. In accordance with some embodiments, a portion of a surface of the planarization layer 106 may have a curved profile.

In accordance with some embodiments, the planarization layer 106 may include an organic material. In accordance with some embodiments, the planarization layer 106 may include, but is not limited to, the material which is also adaptable for the stress-absorbing material, and it is not repeatedly described herein. In accordance with some embodiments, the planarization layer 106 may have a single-layered structure or a multi-layered structure, and the materials of the sub-layers in the multi-layered structure may be the same or different.

In accordance with some embodiments, the aforementioned methods of forming the insulating layer 104 may be used to form the planarization layer 106, but the disclosure is not limited thereto.

Figure 3A:
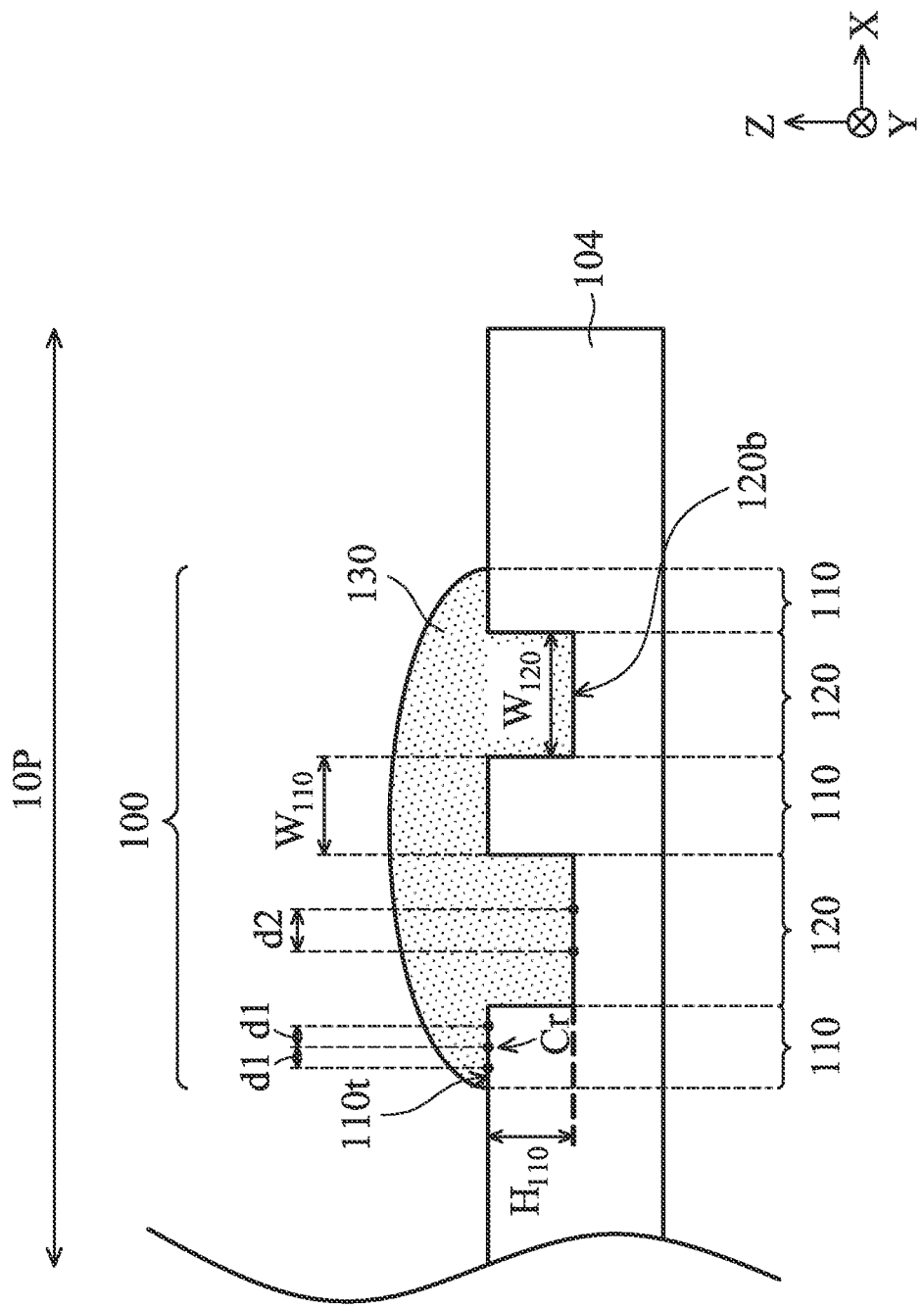
FIG. 3A is a cross-sectional view of a crack stopper structure of an electronic device in accordance with some embodiments of the present disclosure.
Figure 3B:
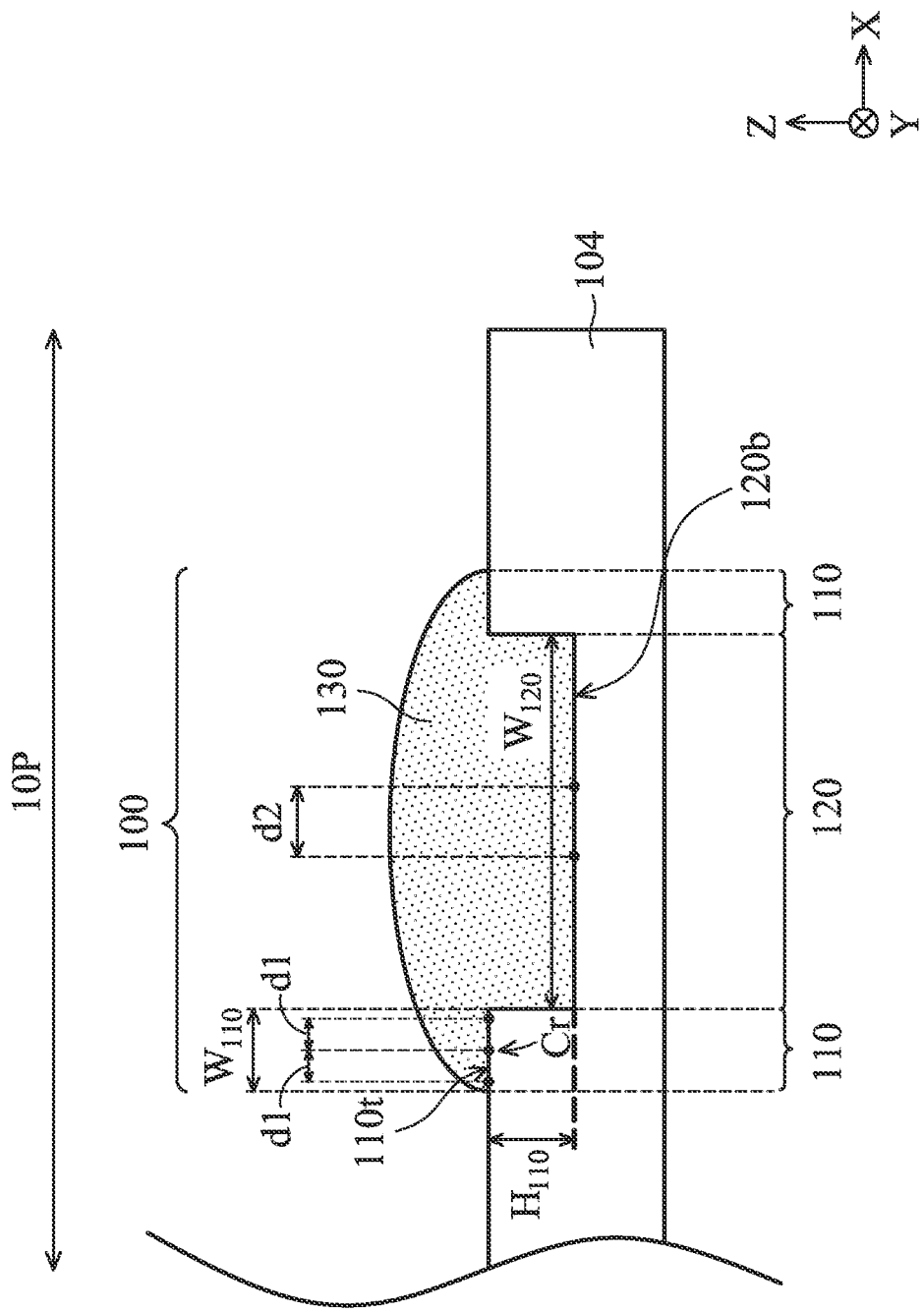
FIG. 3B is a cross-sectional view of a crack stopper structure of an electronic device in accordance with some embodiments of the present disclosure.
Figure 3C:
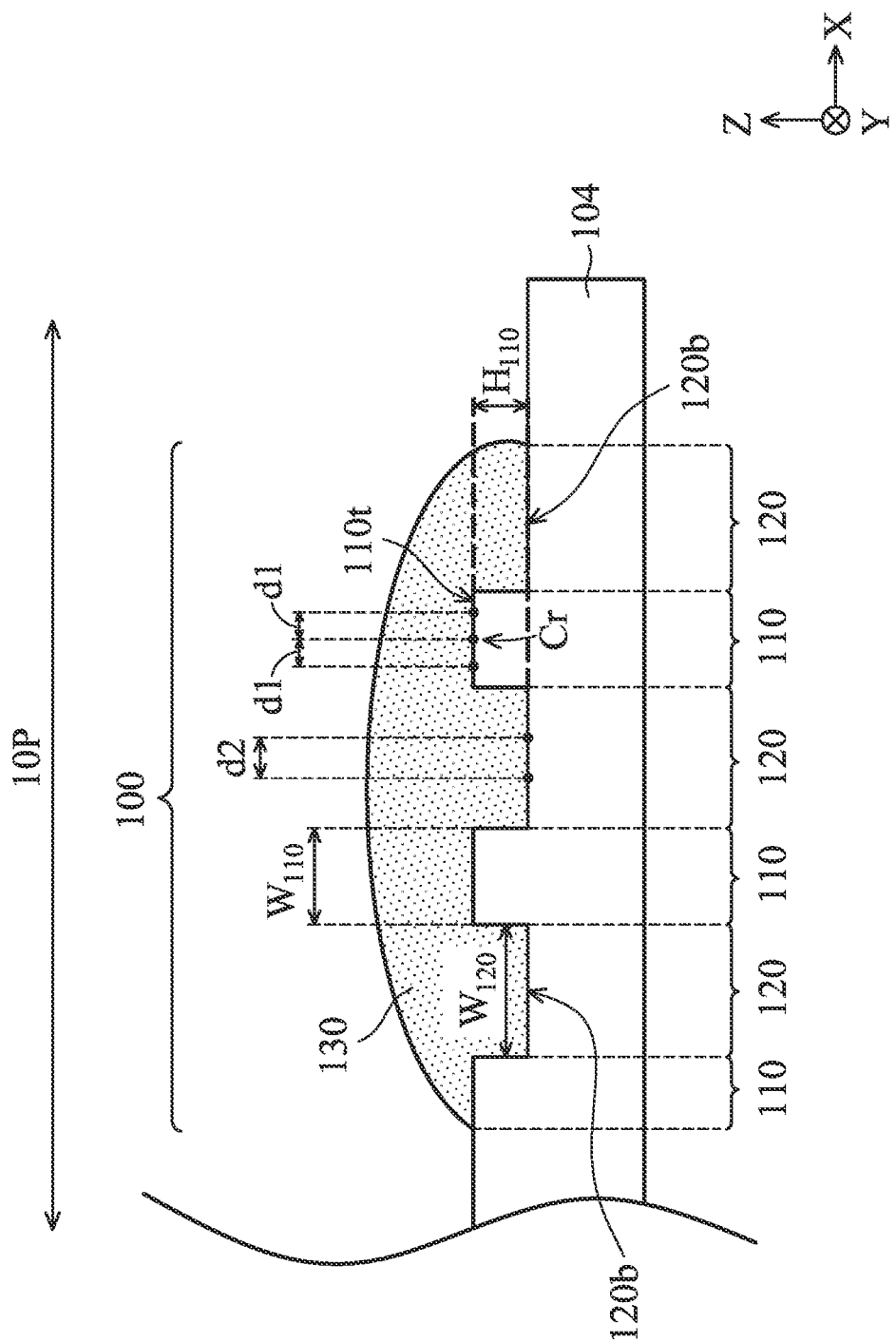
FIG. 3C is a cross-sectional view of a crack stopper structure of an electronic device in accordance with some embodiments of the present disclosure.

Refer to FIGS. 3A-3C, which are cross-sectional views of a crack stopper structure 100 of the electronic device 10 in accordance with some other embodiments of the present disclosure. The definitions of the crack stopper structure 100, the recess(es) 120 and the non-recesses 110 in accordance with various embodiments are further described below in accompanying with FIGS. 3A-3C. It should be understood that some elements of the crack stopper structure 100 are omitted in FIGS. 3A-3C for clarity.

In accordance with the embodiments of the present disclosure, the crack stopper structure 100 may include one or more recesses 120 and two or more non-recesses 110. Specifically, as shown in FIG. 3A, one of the recess 120 may refer to the opening between the two adjacent non-recesses 110. For example, the recess 120 disposed between two non-recesses may have a bottom surface 120b lower than the top surfaces 110t of the non-recesses 110. In addition, one of the non-recess 110 may refer to a portion of the insulating layer 104 that protrudes from (or is higher than) the bottom surfaces 120b. The recesses 120 are respectively located at both sides of the non-recess 110 (e.g., the non-recess 110 that protrudes and is higher than the two adjacent bottom surfaces 120b of the recesses 120 in FIG. 3A). The non-recesses 110 refer to portions of the insulating layer 104 that the top surfaces 110t of the non-recesses 110 are higher than the bottom surface 120b, and covered by the stress-absorbing material 130, as shown in FIGS. 3B and 3C.

Moreover, the width (labeled as $W_{110}$) of the non-recess 110 refers to the maximum width of the non-recess 110 in a direction (e.g., the X direction shown in the drawings, refer to FIG. 1 simultaneously) that is perpendicular to the extending direction of the crack stopper structure 100 (e.g. the extending direction of the recess 120). In accordance with the embodiments of the present disclosure, the "extending direction" of an object refers to a direction along, or substantially parallel to, the long axis of the object. The width (labeled as $W_{120}$) of the recess 120 refers to the maximum width of the bottom surface 120b of the recess 120 in a direction (e.g., the X direction shown in the drawings, refer to FIG. 1 simultaneously) that is perpendicular to the extending direction of the crack stopper structure 100.

In accordance with some embodiments, the height (labeled as $H_{110}$) of the non-recess 110 refers to an average height obtained at a central section of the top surface 110t of the non-recess 110. The average height is obtained from measuring heights at three to five, or even more measuring points in the central section of the top surface 110t of the non-recess 110 in a cross-sectional view. The boundaries of the central section of the top surface 110t are distanced from a center point Cr of the top surface 110t of the non-recess 110 by a distance of d1. In accordance with the embodiments, the distance d1 may be less than or equal to 0.5 μm (0 μm≤d1≤0.5 μm), for example, the distance d1 may be 0.2 μm, 0.3 μm, or 0.4 μm, but it is not limited thereto. Specifically, in accordance with some embodiments, the height (labeled as $H_{110}$) of a non-recess 110 can be defined as an average distance (e.g. obtained from three to five or even more measurements in a cross-sectional view, and the distances between the center point Cr of the top surface 110*t* and the measuring points may be less than or equal to 0.5 μm) between an extending line of the bottom surface 120*b* of a recess 120 and the top surface 110*t* of the non-recess 110 in the normal direction of the substrate (i.e., the Z direction in FIG. 3A to 3C). In addition, the extending line of the bottom surface 120*b* refers to an extending line through two points that are spaced apart by a distance of d2 on the bottom surface 120*b*. In accordance with the embodiments, the recess 120 may be equally divided into three sections in the direction from the active area to the edge (i.e., the X direction in FIG. 3A to 3C), the two points to form the extending line are located in the middle section, and the distance d2 may be 0.5 μm to 1 μm (0.5 μm≤d2≤1 μm), for example, the distance d2 may be 0.6 μm, 0.7 μm, or 0.8 μm, but it is not limited thereto.

It is also noted that in some embodiments, the heights $H_{110}$ of the non-recesses 110 are not always the same, and the greatest height $H_{110}$ will be referred to the representative height $H_{110}$ of the non-recesses 110. Similarly, the depths of the recesses 120 are not always the same, and may affect the measuring result of height $H_{110}$ of the non-recesses 110. The deeper recess 120 may be used in the measurement of the height $H_{110}$. For example, if one non-recess 110 is located between two recesses 120, and the two recesses 120 have different depths in a cross-sectional view, then the deeper recess 120 will be used in the measurement of the height $H_{110}$.

In accordance with the embodiments of the present disclosure, the length, height, and the width of the component can be measured from a microscope, such as an optical microscopy (OM) or a scanning electron microscope (SEM), but it is not limited thereto.

As shown in FIG. 3A, in accordance with some embodiments, the crack stopper structure 100 may include a plurality of recesses 120 and non-recesses 110, for example, two recesses 120 and three non-recesses 110. As shown in FIG. 3B, in accordance with some embodiments, the crack stopper structure 100 may include, for example, one recess 120 and two non-recesses 110. As shown in FIG. 3C, in accordance with some embodiments, the crack stopper structure 100 may include, for example, three recesses 120 and three non-recesses 110.

However, it should be understood that the numbers of the recesses 120 and non-recesses 110 are not limited to those described above in the present disclosure, the crack stopper structure 100 may have other suitable numbers of recesses 120 and non-recesses 110 in accordance with various embodiments.

Figure 4:
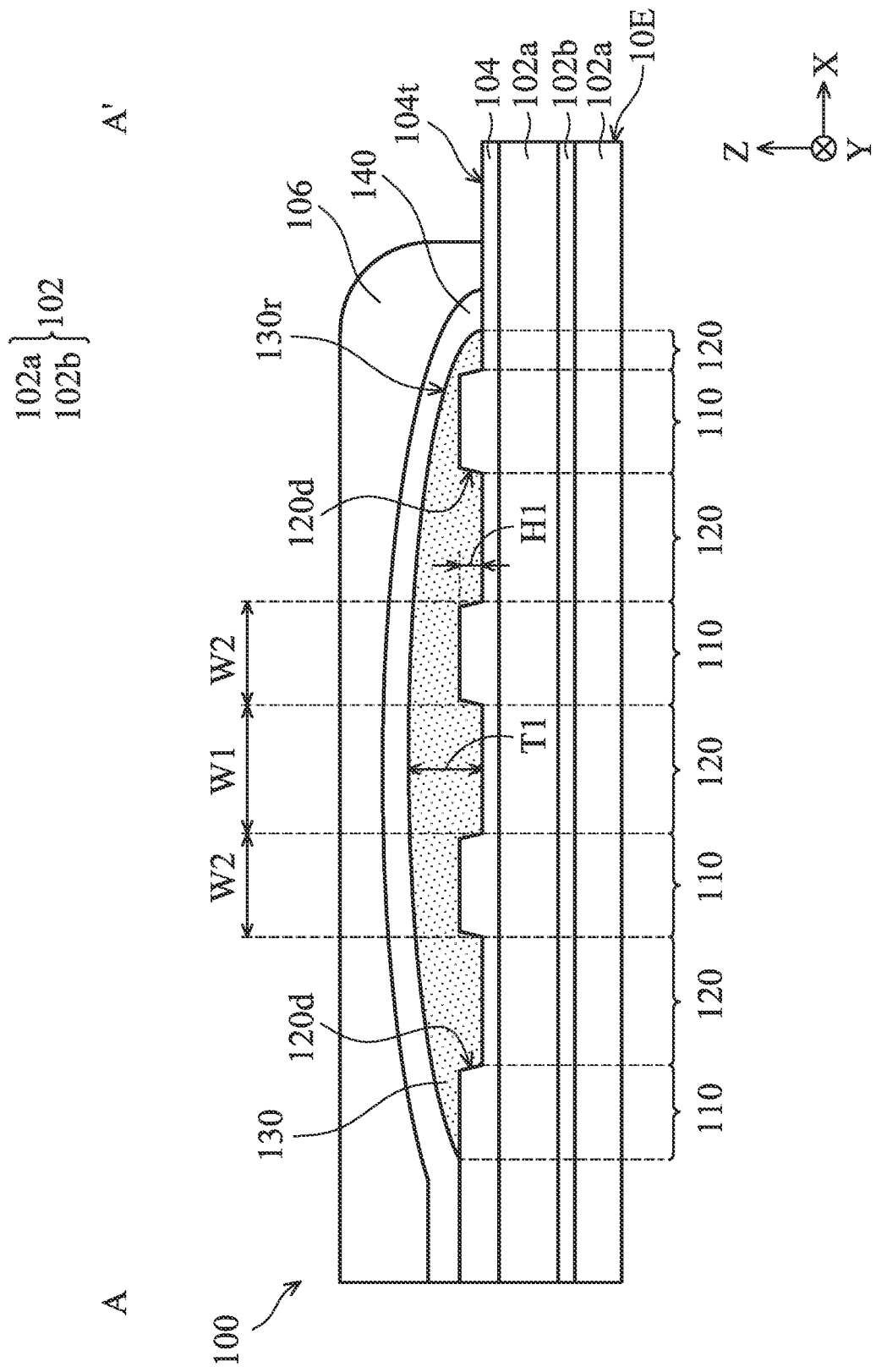
FIG. 4 is a cross-sectional view of an electronic device along line segment A-A' in FIG. 1 in accordance with some embodiments of the present disclosure.

Refer to FIG. 4, which is a cross-sectional view of the electronic device along line segment A-A' in FIG. 1 in accordance with some other embodiments of the present disclosure. In addition, the same or similar components (or elements) in the following paragraph will be denoted by the same or similar reference numbers, and their materials, manufacturing methods and functions are the same or similar to those described above, and thus they will not be repeated in the following context.

As shown in FIG. 4, in accordance with some embodiments, the inorganic layer 140 may be in contact with the insulating layer 104 while the inorganic layer 140 does not extend to the edge 10E. In addition, the inorganic layer 140 may encapsulate the stress-absorbing material 130 between the insulating layer 104 and the inorganic layer 140. In accordance with some embodiments, the stress-absorbing material 130 may be in contact with the recess 120 in one end and in contact with the non-recess 110 in the other end.

In accordance with some embodiments, a thickness T1 of the stress-absorbing material 130 may be greater than the height H1 of the non-recess 110, and the thickness T1 may refer to the maximum thickness of the stress-absorbing material 130 measured in the normal direction of the substrate 102 (i.e., the Z direction in FIG. 4). In accordance with some embodiments, the thickness of the stress-absorbing material 130 may decrease gradually from T1 in a direction toward the edge 10E of the electronic device 10 (i.e., the X direction shown in FIG. 1).

In accordance with some embodiments, the non-recess 110 may have a tapered sidewall 120*d*. In accordance with some embodiments, the non-recess 110 may have a shape of trapezoid. Moreover, in accordance with some embodiments, the substrate 102 may have a multi-layered structure. For example, in accordance with some embodiments, the substrate 102 may include substrate layers 102*a* and a buffer layer 102*b* disposed between the substrate layers 102*a*, but the disclosure is not limited thereto.

In accordance with some embodiments, the materials of the substrate layers 102*a* may include, but are not limited to, polyimide (PI), liquid-crystal polymer (LCP) material, polycarbonate (PC), polyethylene terephthalate (PET), another suitable material, or a combination thereof. In accordance with some embodiments, the substrate layers 102*a* may be formed of the same or different materials.

In accordance with some embodiments, the material of the buffer layer 102*b* may include an organic material or an inorganic material mentioned above, and it is not repeated herein.

Figure 5:
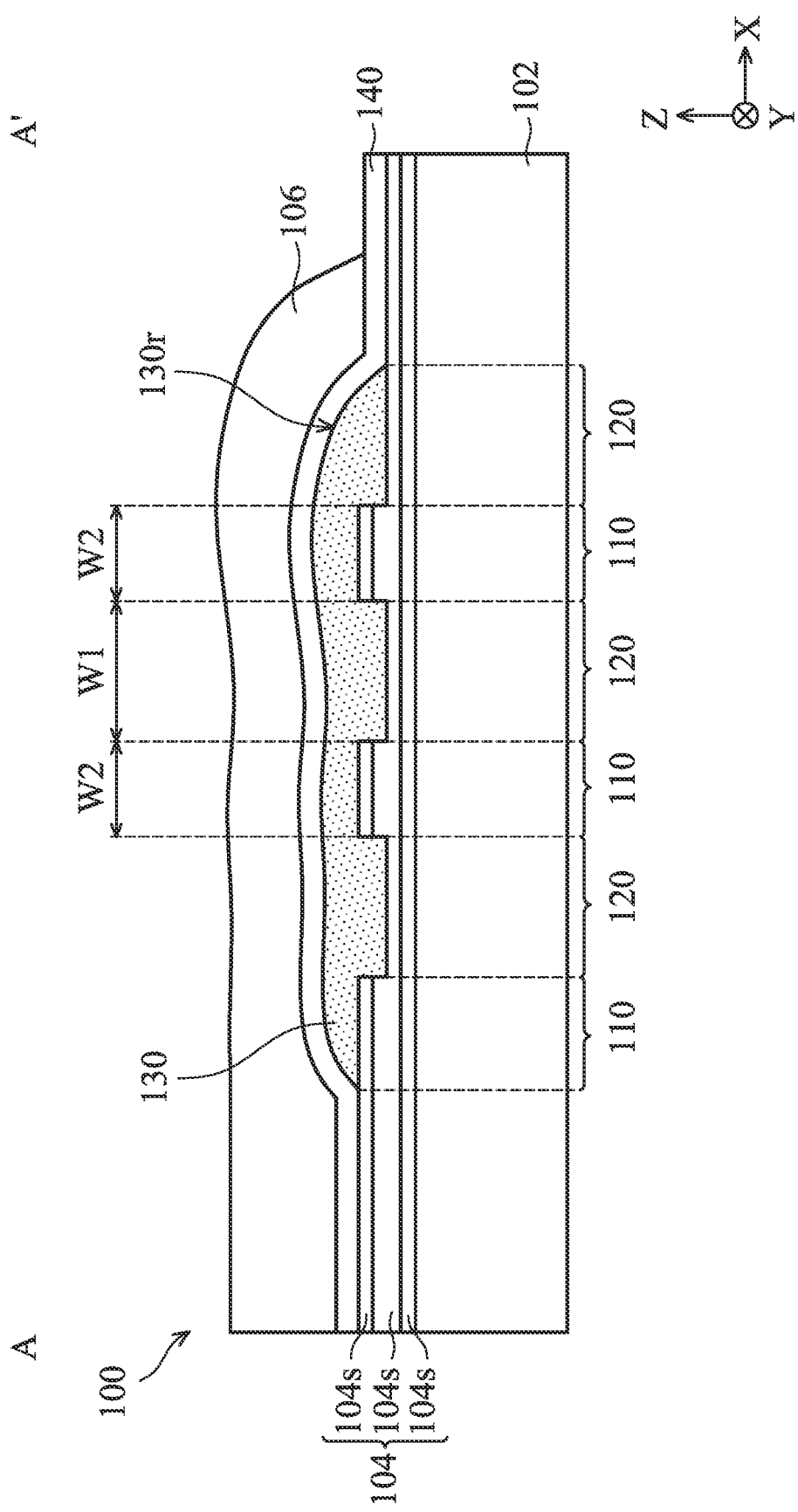
FIG. 5 is a cross-sectional view of an electronic device along line segment A-A' in FIG. 1 in accordance with some embodiments of the present disclosure.

Refer to FIG. 5, which is a cross-sectional view of the electronic device along line segment A-A' in FIG. 1 in accordance with some other embodiments of the present disclosure.

As shown in FIG. 5, in accordance with some embodiments, the insulating layer 104 may have a multi-layered structure, that is, the insulating layer 104 may include a plurality of sub-layers 104*s*. In accordance with some embodiments, the materials of a part of these sub-layers 104*s* may be the same or different. In this embodiment in FIG. 5, the top surface of the non-recess 110 refers to the top surface of the topmost sub-layers 104*s*.

In accordance with some embodiments, the materials of the sub-layers 104*s* may include, but are not limited to, silicon oxide, silicon nitride, silicon oxynitride, high-k dielectric material, another suitable dielectric material, or a combination thereof. The high-k dielectric material may include, but is not limited to, a metal oxide, a metal nitride, a metal silicide, a metal aluminate, a zirconium silicate, a zirconium aluminate, or a combination thereof.

Figure 6:
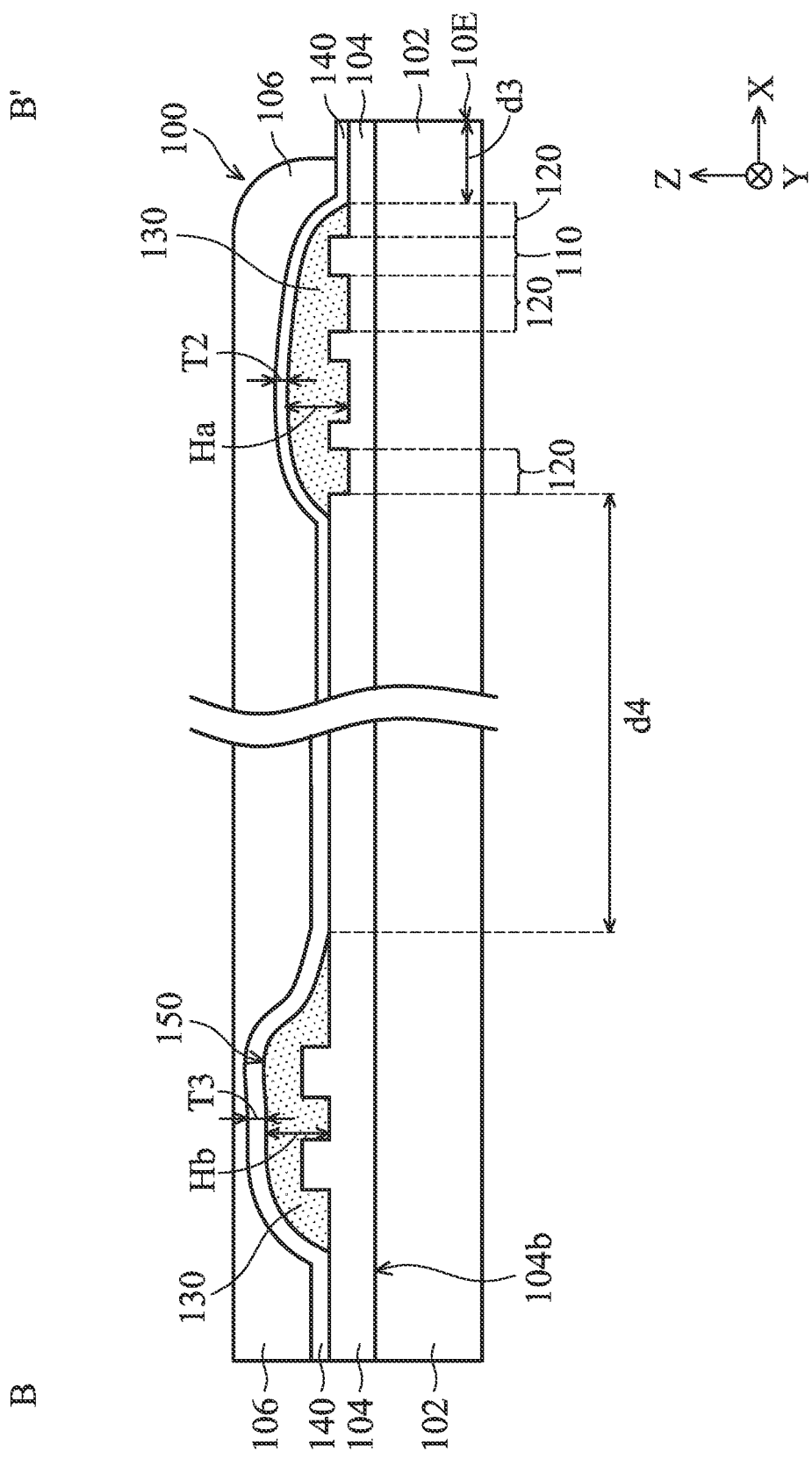
FIG. 6 is a cross-sectional view of an electronic device along line segment B-B' in FIG. 1 in accordance with some embodiments of the present disclosure.

Refer to FIG. 6, which is a cross-sectional view of the electronic device 10 along line segment B-B' in FIG. 1 in accordance with some embodiments of the present disclosure. FIG. 6 illustrates a portion of the peripheral area 10P including the crack stopper structure 100 and the dam structure 150 in accordance with some embodiments.

As shown in FIG. 6, in accordance with some embodiments, the recess 120 and the edge 10E may be separated by a distance d3. In accordance with some embodiments, the distance d3 may be less than 120 μm (i.e., 0 μm<d3<120 μm), for example, the distance d3 may be 40 μm, 70 μm, or 100 μm, but the disclosure is not limited thereto. In accordance with some embodiments, the distance d3 may refer to the distance between the edge 10E and the recess 120 that is closest to the edge 10E, that is, the minimum distance between the edge 10E and the recess 120. It should be noted that in FIG. 6, the rightmost recess is covered by the stress-absorbing material 130, and the distance d3 may be the minimum distance between the edge 10E and the edge of the stress-absorbing material 130 in the direction perpendicular to the extending direction of the crack stopper structure 100.

In accordance with some embodiments, the recess 120 and the non-recesses 110 may be disposed between the dam structure 150 and the edge 10E. The dam structure 150 may serve as a blocking wall to reduce the overflowing of at least one organic layer (not shown). It should be noted that in FIG. 6, the dam structure 150 may only include the stress-absorbing material 130, but it is not limited thereto. In accordance with some embodiments, the dam structure 150 may be formed on the insulating layer 104. In accordance with some embodiments, an overall height Hb of the dam structure 150 may be greater than an overall height Ha of stress-absorbing material 130 covering the recesses 120, but the disclosure is not limited thereto. In accordance with some embodiments, the height Ha may refer to the maximum height of the stress-absorbing material 130 covering the recesses 120 (i.e., the thickness T1 in FIG. 4), and the overall height Hb may refer to the maximum height of the stress-absorbing material 130 of the dam structure 150 measured in a normal direction of the substrate 102. In some embodiments, the overall height Hc of the non-recess underlying the dam structure 150 may be greater than the overall height Hd of the non-recess 110, but it is not limited thereto.

In addition, the dam structure 150 and the recess 120 may be separated by a distance d4. In accordance with some embodiments, the distance d4 may be less than 210 μm (0 μm<d4<210 μm), for example, the distance d4 may be 50 μm, 100 μm, or 150 μm, but the disclosure is not limited thereto. In accordance with some embodiments, the distance d4 may refer to the distance between the dam structure 150 and the recess 120 that is closest to the dam structure 150, in other words, the distance d4 is the minimum distance between the dam structure 150 and the recess 120 in the direction perpendicular to the extending direction of the crack stopper structure 100.

In accordance with some embodiments, the inorganic layer 140 extends from the active area (e.g., the active area 10A in FIG. 1) to the crack stopper structure 100, the inorganic layer 140 covering the crack stopper structure 100 may have a maximum thickness T2, and the inorganic layer 140 covering the dam structure 150 may have a maximum thickness T3. In accordance with some embodiments, the thickness T2 of the inorganic layer 140 covering the crack stopper structure 100 may be less than the thickness T3 of the inorganic layer 140 covering the dam structure 150. In accordance with some embodiments, the thickness of the inorganic layer 140 that is close to the edge 10E of the electronic device 10 may be less than the thickness of the inorganic layer 140 that is farther from the edge 10E.

Figure 7:
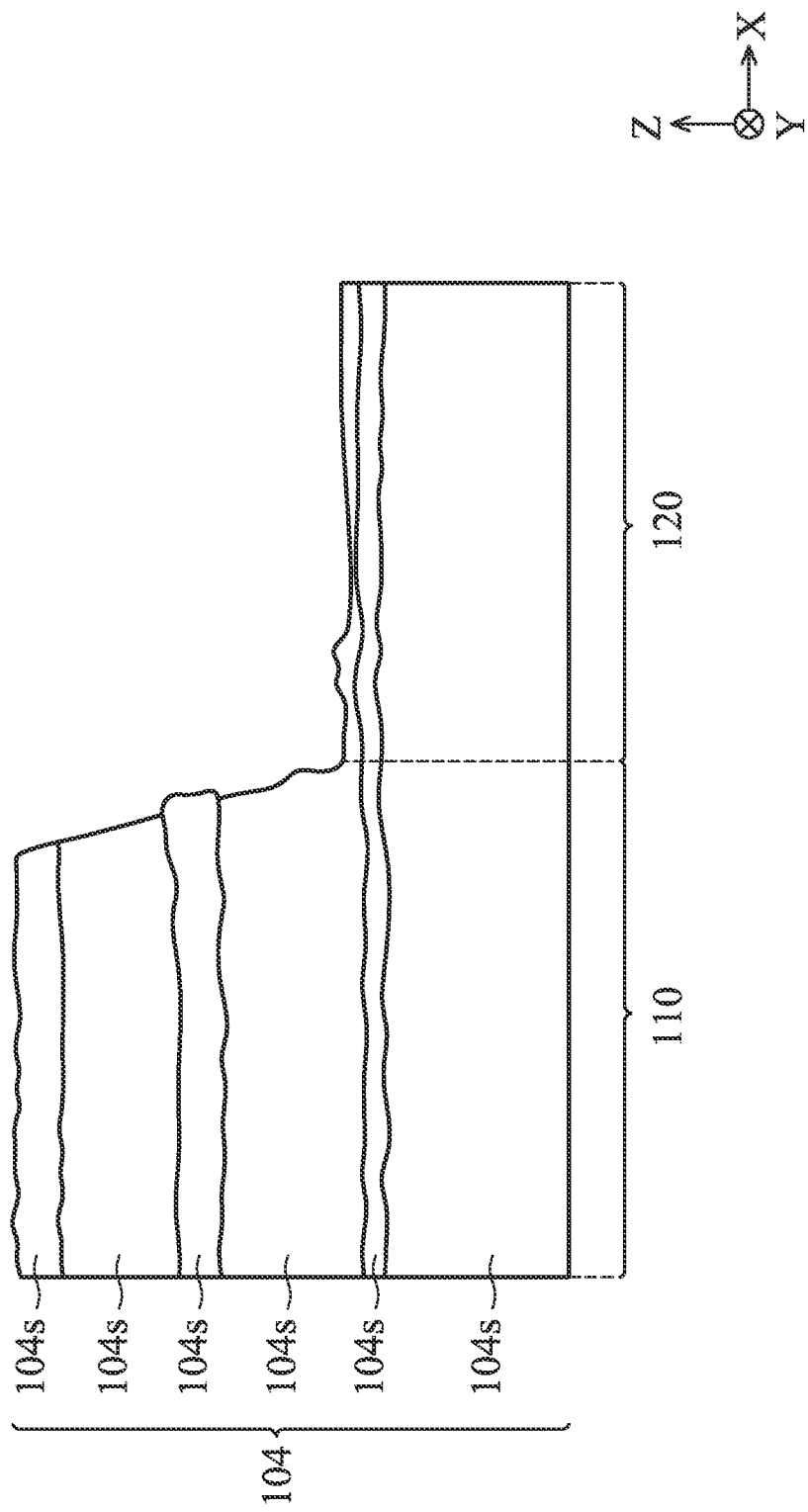
FIG. 7 is a partial enlarged cross-sectional view of a crack stopper structure of an electronic device in accordance with some embodiments of the present disclosure.

Refer to FIG. 7, which is a partial enlarged cross-sectional view of the crack stopper structure 100 of the electronic device 100 in accordance with some embodiments of the present disclosure.

As described above, the insulating layer 104 may have a multi-layered structure, and include a plurality of sub-layers 104s in accordance with some embodiments. may include several sub-layers 104s. In accordance with some embodiments, a number of sub-layers 104s at the position corresponding to the recess 120 may be less than a number of sub-layers 104s at the position corresponding to the non-recess 110. For example, in accordance with some embodiments, the insulating layer 104 corresponding to the recess 120 may have three sub-layers 104s and the insulating layer 104 corresponding to the non-recess 110 may have six sub-layers 104s.

In accordance with some embodiments, the thickness of one sub-layers 104s may be different from the thickness of another sub-layers 104s, but the present disclosure is not limited thereto.

Figure 8:
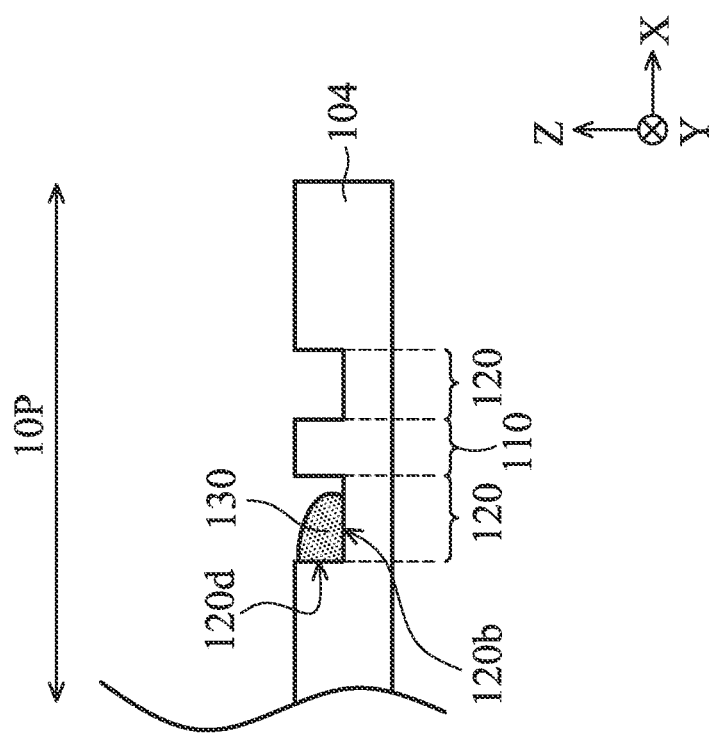
FIG. 8 is a cross-sectional view of a crack stopper structure of an electronic device in accordance with some embodiments of the present disclosure.

Refer to FIG. 8, which is a cross-sectional view of the crack stopper structure 100 of the electronic device 10 in accordance with some other embodiments of the present disclosure. It should be noted that some elements of the crack stopper structure 100 are omitted in FIG. 8 for clarity.

As shown in FIG. 8, in accordance with some embodiments, the stress-absorbing material 130 may be partially disposed in the recess 120. In other words, the stress-absorbing material 130 may be partially filled in the recess 120. In accordance with some embodiments, the stress-absorbing material 130 may contact a part of the bottom surface 120b or the entire bottom surface 120b of the recess 120. In accordance with some embodiments, the stress-absorbing material 130 may be in contact with a part of the sidewall 120d or entire sidewall 120d of the non-recess 110. In accordance with some embodiments, the stress-absorbing material 130 may be in contact with the recess 120 but not in contact with the non-recess 110.

Figure 9:
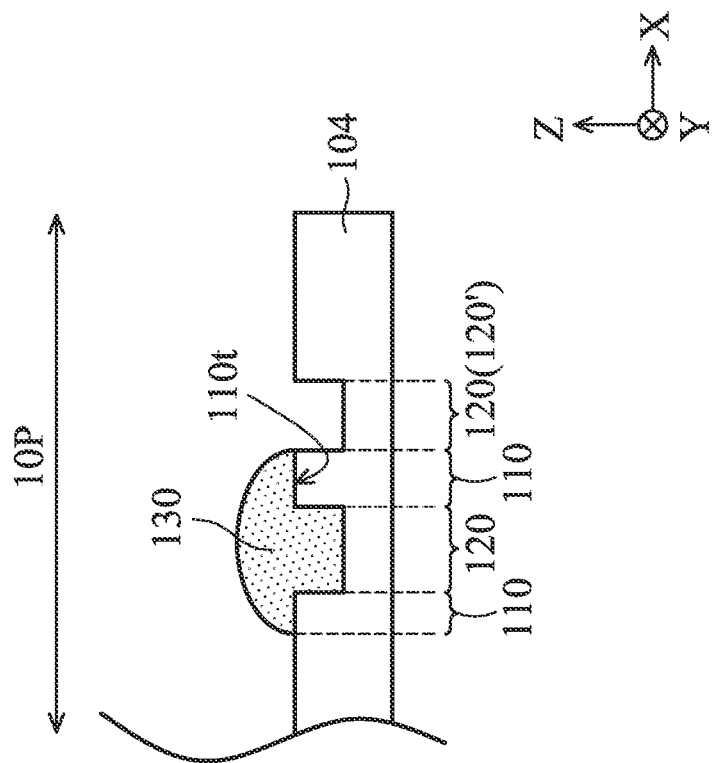
FIG. 9 is a cross-sectional view of a crack stopper structure of an electronic device in accordance with some embodiments of the present disclosure.

Refer to FIG. 9, which is a cross-sectional view of the crack stopper structure 100 of the electronic device 10 in accordance with some other embodiments of the present disclosure. It should be noted that some elements of the crack stopper structure 100 are omitted in FIG. 9 for clarity.

As shown in FIG. 9, in accordance with some embodiments, the stress-absorbing material 130 may be disposed in one recess 120 and disposed on the two non-recesses 110 that are adjacent to the one recess 120, and not disposed in the adjacent recess 120 (labeled as 120'). In accordance with some embodiments, the stress-absorbing material 130 may be in contact with the top surfaces 110t of the two non-recesses 110.

To summarize, in accordance with some embodiments of the present disclosure, the provided crack stopper structure includes the recess and the non-recesses that are configured in a specific manner, and the edge of the substrate is less likely to be cracked when an external force is applied thereto. In accordance with some embodiments, the crack stopper structure includes the stress-absorbing material covering the recess and the non-recess, and therefore the crack stopper structure can reduce the stress transferred from the edge of the substrate to the active area of the electronic device.

Although some embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes an individual embodiment, and the claimed scope of the present disclosure also includes the combinations of the claims and embodiments. The features of the various embodiments can be used in any combination as long as they do not depart from the spirit and scope of the present disclosure. The scope of protection of present disclosure is subject to the definition of the scope of the appended claims.

What is claimed is:

1. An electronic device, comprising:
   at least three non-recesses;
   a recess disposed between two adjacent ones of the at least three non-recesses;
   another recess adjacent to one of the at least three non-recesses, wherein the at least three non-recesses, the recess, and the another recess are formed in an insulating layer;
   an organic layer disposed on the at least three non-recesses and in the recess and the another recess, wherein the organic layer comprises two ends, wherein one of the two ends is in direct contact with one of the at least three non-recesses, and another one of the two ends is in contact with the another recess; and
   a planarization layer covering the at least three non-recesses, the recess, the another recess and the two ends of the organic layer.

2. The electronic device as claimed in claim 1, wherein the electronic device comprises an active area and a peripheral area, the peripheral area is disposed adjacent to the active area and comprises the at least three non-recesses, the recess, and an edge, and wherein the at least three non-recesses are located between the edge and the active area.

3. The electronic device as claimed in claim 2, wherein the insulation layer extends from the active area to the peripheral area.

4. The electronic device as claimed in claim 1, wherein the organic layer has a curved profile.

5. The electronic device as claimed in claim 1, further comprising an inorganic layer covering the organic layer, wherein the inorganic layer has a curved profile at a position corresponding to the organic layer.

6. The electronic device as claimed in claim 5, wherein the electronic device comprises an active area and a peripheral area, the peripheral area is disposed adjacent to the active area, and the inorganic layer extends from the active area to the peripheral area.

7. The electronic device as claimed in claim 1, wherein the electronic device comprises an active area and a peripheral area, the peripheral area is disposed adjacent to the active area and comprises a dam structure, the at least three non-recesses, the recess, and an edge, and wherein the dam structure is disposed on the insulation layer, and the at least three non-recesses are located between the edge and the dam structure.

8. The electronic device as claimed in claim 7, wherein an overall height of the dam structure is greater than an overall height of the organic layer.

9. The electronic device as claimed in claim 1, wherein the insulating layer comprises a multi-layered structure, and the multi-layered structure comprises more sub-layers at a position corresponding to one of the at least three non-recesses than at a position corresponding to the recess.

10. The electronic device as claimed in claim 9, wherein a thickness of one of the sub-layers is different from a thickness of another one of the sub-layers.

* * * * *